United States Patent
Kaibuki et al.

(10) Patent No.: US 10,887,989 B2
(45) Date of Patent: Jan. 5, 2021

(54) PRINTED WIRING BOARD

(71) Applicants: SUMITOMO ELECTRIC PRINTED CIRCUITS, INC., Shiga (JP); SUMITOMO ELECTRIC INDUSTRIES, LTD., Osaka (JP)

(72) Inventors: Tadahiro Kaibuki, Shiga (JP); Daisuke Sato, Shiga (JP); Haruna Oya, Shiga (JP); Yoshiaki Yanagimoto, Shiga (JP); Atsushi Kimura, Osaka (JP); Shigeki Shimada, Osaka (JP)

(73) Assignees: SUMITOMO ELECTRIC PRINTED CIRCUITS, INC., Shiga (JP); SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 16/639,270

(22) PCT Filed: Aug. 3, 2018

(86) PCT No.: PCT/JP2018/029255
§ 371 (c)(1),
(2) Date: Feb. 14, 2020

(87) PCT Pub. No.: WO2019/039237
PCT Pub. Date: Feb. 28, 2019

(65) Prior Publication Data
US 2020/0245461 A1 Jul. 30, 2020

(30) Foreign Application Priority Data
Aug. 21, 2017 (JP) .................. 2017-158864

(51) Int. Cl.
*H05K 1/11* (2006.01)
*H05K 1/02* (2006.01)
*H05K 3/42* (2006.01)

(52) U.S. Cl.
CPC .......... *H05K 1/115* (2013.01); *H05K 1/0277* (2013.01); *H05K 3/42* (2013.01); *H05K 2201/09509* (2013.01); *H05K 2201/09645* (2013.01)

(58) Field of Classification Search
CPC .......... H05K 2201/09827; H05K 2201/09854; H05K 2201/09836; H05K 2201/09154;
(Continued)

(56) References Cited

U.S. PATENT DOCUMENTS 3,190,953 A * 6/1965 Keller .................... H01R 12/58
174/262
6,787,443 B1 * 9/2004 Boggs .................... H05K 1/116
29/852
(Continued)

FOREIGN PATENT DOCUMENTS

JP H03-054884 3/1991
JP H05-082969 4/1993
(Continued)

*Primary Examiner* — Roshn K Varghese
(74) *Attorney, Agent, or Firm* — IPUSA, PLLC

(57) ABSTRACT

A printed wiring board of the present invention includes an insulating substrate layer; a first conductive layer laminated to one surface of the substrate layer; a second conductive layer laminated to another surface of the substrate layer; and a via hole formed along an inner surface of a connection hole that is provided, in a thickness direction, through the substrate layer and the first conductive layer, the via hole electrically coupling the first conductive layer and the second conductive layer. A cross-sectional shape of the connection hole along at least one surface of the substrate layer is an irregular shape.

6 Claims, 3 Drawing Sheets

(58) Field of Classification Search
CPC ... H05K 2201/09881; H05K 2201/099; H05K 2201/09745; H05K 2201/09454; H05K 2201/0939; H05K 2201/09645; H05K 2203/0346; H05K 1/116; H05K 1/112; H05K 1/113; H05K 1/115; H05K 2201/09163; H05K 2201/09181
USPC .......................................................... 174/262
See application file for complete search history.

(56) References Cited

U.S. PATENT DOCUMENTS

| | | | |
|---|---|---|---|
| 10,426,031 B2* | 9/2019 | Kaibuki | H05K 1/09 |
| 2002/0093091 A1* | 7/2002 | Huang | H05K 1/116 |
| | | | 257/706 |
| 2007/0089292 A1* | 4/2007 | Tourne | H05K 1/115 |
| | | | 29/852 |
| 2009/0288859 A1* | 11/2009 | Ho | H05K 1/0219 |
| | | | 174/252 |
| 2010/0212947 A1* | 8/2010 | Yamanaka | H01L 23/49827 |
| | | | 174/260 |
| 2011/0051386 A1* | 3/2011 | Nagasawa | H05K 1/115 |
| | | | 361/783 |
| 2011/0273855 A1* | 11/2011 | Kim | H05K 1/0265 |
| | | | 361/760 |
| 2013/0222105 A1 | 8/2013 | Sakai et al. | |

FOREIGN PATENT DOCUMENTS

| | | | |
|---|---|---|---|
| JP | 2010-251402 | 11/2010 | |
| JP | 2013-175504 | 9/2013 | |
| WO | WO-2016063799 A1 * | 4/2016 | ............. H05K 1/028 |

* cited by examiner

PRINTED WIRING BOARD

TECHNICAL FIELD

The present disclosure relates to a printed wiring board. The present application claims priority to Japanese Patent Application No. 2017-158864, filed Aug. 21, 2017, the contents of which are incorporated herein by reference in their entirety.

BACKGROUND ART

In recent years, electronic devices have been reduced in size, and dense wiring is required for printed wiring boards used in electronic devices. On such a demand, multilayer printed wiring boards having a plurality of patterned conductive layers are often utilized. By forming a given hole provided through a substrate layer to form a metal layer on an inner surface of the hole, such a multilayer printed wiring board often includes each via hole that couples patterns of different conductive layers.

In order to increase wiring density of such a multilayer printed wiring board, it is also necessary to reduce a diameter of a via hole. However, if the diameter of the via hole is reduced, a bubble is retained in a hole that is formed in a substrate layer, and thus a plating solution is not able to be injected, which may result in a connection failure of conductive layers.

Particularly, when a blind via hole that allows for reductions in a footprint area is used, a land is not required to be formed in one conductive layer, and a bubble is more likely to be retained in a given hole in a substrate layer, and a connection failure of conductive layers is more likely to occur.

In this regard, in forming a blind via hole, a technique is proposed to form a tapered hole by a drill whose diameter gradually increases from a tip in order to facilitate removal of bubbles, so that plating is reliably performed (see Japanese Unexamined Patent Application Laid-Open No. 5-82969).

CITATION LIST

Patent Literature

[PTL 1] Japanese Unexamined Patent Application Publication No. 5-82969

SUMMARY OF INVENTION

A printed wiring board according to one manner of the present disclosure includes an insulating substrate layer; a first conductive layer laminated to one surface of the substrate layer; a second conductive layer laminated to another surface of the substrate layer; and a via hole formed along an inner surface of a connection hole that is provided, in a thickness direction, through the substrate layer and the first conductive layer, the via hole electrically coupling the first conductive layer and the second conductive layer, wherein a cross-sectional shape of the connection hole along at least one surface of the substrate layer is an irregular shape.

DESCRIPTION OF EMBODIMENTS

Figure 1:
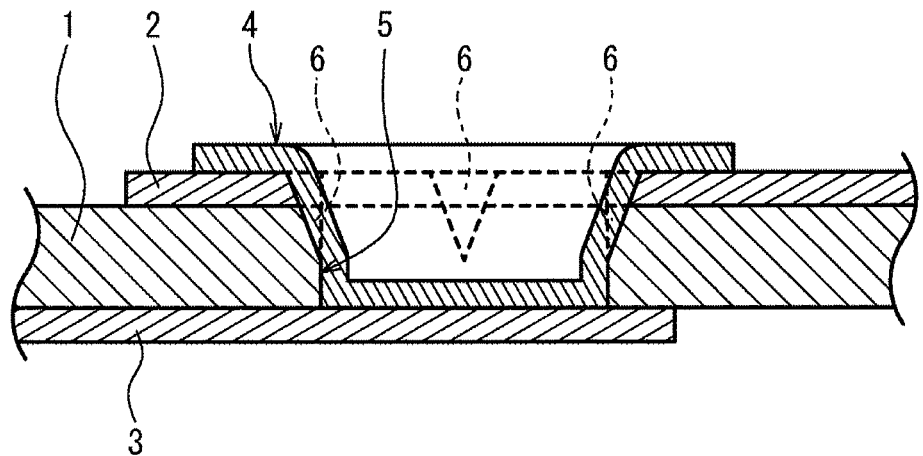
FIG. 1 is a schematic cross-sectional view of a printed wiring board according to one embodiment of the present disclosure.

[Problems to be Solved by the Present Disclosure]

As disclosed in the Publication, in a method of using a drill, a diameter of a via hole cannot be sufficiently reduced, and thus dense wiring is restricted.

Additionally, as a result of verification by the inventors of the present application, it has been recognized that, when a hole diameter is small, e.g., 100 µm or less, a plating solution cannot be reliably injected only by tapering a hole, and thus a connection failure of conductive layers may occur.

In view of the situation described above, the present disclosure is addressed and provides a solution to provide a printed wiring board whereby a connection between conductive layers is reliably made through a via hole.

[Effect of the Present Disclosure]

In a printed wiring board according to one manner of the present disclosure, a connection between conductive layers is reliably made through a via hole.

[Description of Embodiments of the Present Disclosure]

A printed wiring board according to one manner of the present disclosure includes an insulating substrate layer; a first conductive layer laminated to one surface of the substrate layer; a second conductive layer laminated to another surface of the substrate layer; and a via hole formed along an inner surface of a connection hole that is provided, in a thickness direction, through the substrate layer and the first conductive layer, the via hole electrically coupling the first conductive layer and the second conductive layer, wherein a cross-sectional shape of the connection hole that is along at least one surface of the substrate layer is an irregular shape.

For the printed wiring board, with a cross-sectional shape of the connection hole that is along at least one surface of the substrate layer being an irregular shape, in a case of forming a via hole by plating, variation in a flow velocity of a plating solution that flows into the connection hole is increased. Thereby, the air in the connection hole is prevented from being retained as a dome-shaped bubble, and thus the connection hole can be filled with a plating solution. For this reason, with respect to the printed wiring board, a via hole is formed along an inner surface of the connection hole to have an even thickness, and thus the connection between the first conductive layer and the second conductive layer is reliably made through the via hole.

For the printed wiring board, the connection hole may include an expansion section for partially expanding an edge of the cross-sectional shape of the connection hole that is along at least one surface of the substrate layer. In such a manner, with the connection hole including an expansion section, variation in a flow rate of a plating solution to the connection hole can increase through the expansion section, so that the air in the connection hole can be more efficiently ejected.

For the printed wiring board, a cross-sectional area of the expansion section taken along the thickness direction may be increased toward the first conductive layer with respect to the second conductive layer. In such a manner, with respect to the expansion section, when the cross-sectional area is increased toward the first conductive layer with respect to the second conductive layer, a flow path area where a plating solution flows from the expansion section gradually decreases, and thus a flow velocity increases. Accordingly, the air in the connection hole can be more reliably ejected.

For the printed wiring board, the expansion section may not be present at another surface of the substrate layer. In such a manner, with the expansion section not being present at another surface of the substrate layer, the maximum size of the connection hole that is at another surface of the substrate layer can be reduced. Thereby, wiring density of the second conductive layer can be increased.

For the printed wiring board, a mean diameter for expansion sections at an outer surface of the first conductive layer may be 0.1 to 0.5 times a mean diameter for portions of the connection holes each excluding one or more expansion sections. In such a manner, with a mean diameter for expansion sections at an outer surface of the first conductive layer being in a range described above with respect to a mean diameter for the portions of the connection holes each excluding expansion sections, the air in the connection hole is reliably ejected through a plating solution, as well as a land for connecting a given via hole toward the first conductive layer not being excessively increased.

For the printed wiring board, the portions of the connection holes each excluding one or more expansion sections may have a mean diameter of from 30 μm to 150 μm. In such a manner, with the portions of the connection holes each excluding expansion sections having a mean diameter in a range described above, the printed wiring board provides an advantage, compared to a printed wiring board in related art, e.g., there is a remarkable difference in a defect occurrence rate of a via hole.

In this description, a "mean diameter" means an equivalent circle diameter. Specifically, a "mean diameter" for expansion sections at an outer surface of the first conductive layer" refers to a mean value of diameters each corresponding to respective arcs, each of the arcs being the outer edge of the corresponding expansion section, such that each of the diameters is of a circle that includes an area bounded by the outer edge of the expansion section and a chord joining both outer edge ends of the expansion section, at the outer surface of the first conductive layer. Further, a mean diameter for portions of the connection holes each excluding one or more expansion sections is determined as a mean value of diameters each corresponding to respective arcs, each arc defining an arc area equivalent to the area bounded by the outer edge of the portion of the corresponding connection hole excluding the expansion sections and chords each joining both outer edge ends of the corresponding expansion section.

[Details of Embodiments of the Present Disclosure]

Each embodiment will be hereinafter described in detail using a printed wiring board in the present disclosure with reference to the drawings.

[First Embodiment]

FIG. 1 illustrates a printed wiring board according to one embodiment of the present disclosure. The printed wiring board is a flexible printed wiring board.

The printed wiring board includes an insulating substrate layer 1; a first conductive layer 2 laminated to one surface of the substrate layer 1; a second conductive layer 3 laminated to another surface of the substrate layer 1; and a via hole 4 that is formed through the substrate layer 1 and that electrically couples the first conductive layer 2 and the second conductive layer 3.

In order to form the via hole 4, the printed wiring board includes a connection hole 5 that is formed so as to pass through the substrate layer 1 and the first conductive layer 2, in a thickness direction. The via hole 4 is formed of a metal with which an inner surface of the connection hole 5; a portion of the first conductive layer 2 on an opposite side of the substrate layer 1 that is on the periphery of the connection hole 5; and a portion of the second conductive layer 3 that is exposed on the inside of the connection hole 5, are continuously plated. In other words, the via hole 4 is a blind via hole that does not pass through the second conductive layer 3.

Figure 2:
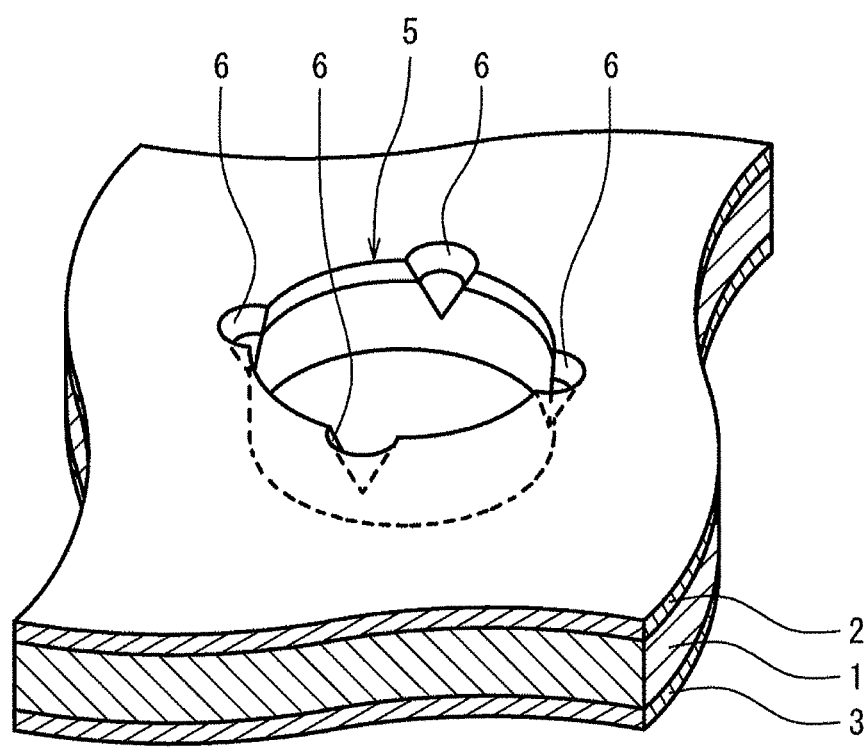
FIG. 2 is a schematic perspective view of a connection hole of the printed wiring board in FIG. 1.

For an illustration of a shape of the connection hole 5, FIG. 2 illustrates a state before forming of the via hole 4 and patterning of the first conductive layer 2 and the second conductive layer 3. As illustrated, with respect to the connection hole 5, a cross-sectional shape at at least one surface of the substrate layer 1 (surface to which a first conductive layer 2 is laminated) is an irregular shape. More specifically, the connection hole 5 includes each expansion section 6 for partially expanding an edge of the cross-sectional shape of the connection hole that is at at least one surface of the substrate layer 1.

A given expansion section 6 is formed such that a cross-sectional area taken along a thickness direction increases toward the first conductive layer 2 with respect to the second conductive layer 3. Further, with respect to a given expansion section 6, the cross-sectional area thereof becomes zero within the substrate layer 1, and the expansion section is not present at another surface (surface to which a second conductive layer is laminated) of the substrate layer 1.

For the printed wiring board, with a cross-sectional shape of the connection hole 5 along at least one surface of the substrate layer 1 being an irregular shape, in a case of forming a via hole 4 by plating, variation in a flow velocity of a plating solution that flows into the connection hole 5 is increased. Thereby, the air in the connection hole 5 is prevented from being retained as a dome-shaped bubble, and thus the connection hole 5 can be filled with a plating solution. For this reason, with respect to the printed wiring board, a via hole 4 is formed along an inner surface of the connection hole 5 to have an even thickness, and thus a connection between the first conductive layer 2 and the second conductive layer 3 is reliably made through the via hole 4.

In particular, for the printed wiring board, with the connection hole 5 including each expansion section 6, variation in a flow rate of a plating solution to the connection hole 5 can further increase through a given expansion section 6, so that the air in the connection hole 5 can be more efficiently ejected.

Additionally, a given expansion section 6 is formed such that the above cross-sectional area is increased toward the first conductive layer 2 with respect to the second conductive layer 3. Thereby, a flow path area where a plating solution flows from the expansion section 6 gradually decreases downstream in a flow direction, and thus a flow velocity of a plating solution that flows from the expansion section 6 increases. Accordingly, the air in the connection hole 5 can be more reliably ejected.

Further, with a given expansion section 6 not being present at another surface of the substrate layer 1, the maximum size of the connection hole 5 at another surface of the substrate layer 1 can be reduced. Thereby, the second conductive layer 3 that seals another end portion of the connection hole 5 can be reduced in width, and thus wiring density of the second conductive layer 3 can be further increased.

Each component of the printed wiring board will be described below in detail.

<Substrate Layer>

Examples of a material of the substrate layer 1 include polyamide, polyimide, polyamideimide, polyester, and the like. Among these, polyamide, polyimide and polyamideimide are each preferably used from the viewpoint of mechanical strength such as heat resistance.

A lower limit of a mean thickness of the substrate layer 1 is preferably 5 µm, and more preferably 10 µm. On the other hand, an upper limit of a mean thickness of the substrate layer 1 is preferably 500 µm, and more preferably 150 µm. If a mean thickness of the substrate layer 1 is smaller than the above lower limit, the substrate layer 1 may have insufficient strength. Additionally, if a mean thickness of the substrate layer 1 exceeds the above upper limit, flexibility may be insufficient.

<Conductive Layer>

The first conductive layer 2 and the second conductive layer 3 are each formed by patterning a layered conductor that is laminated to the substrate layer 1.

A method of laminating a conductor that includes each of the first conductive layer 2 and the second conductive layer 3, to the substrate layer 1 is not particularly restricted. For example, a bonding method of bonding a sheet-like conductor with an adhesive; a casting method of applying a resin composition that is a material of the substrate layer 1, to a sheet-like conductor; a sputtering or plating method of forming, by plating, a metal conductive layer on a thin conductive layer (seed layer) that has a thickness of several nm and that is formed on the substrate layer 1 by sputtering or an evaporation method; a laminating method of attaching a sheet-like conductor to the substrate layer 1 by a thermal press; or the like, can be used.

As a method of patterning a layered conductor to form each of the first conductive layer 2 and the second conductive layer 3, for example, a known subtractive method of forming a resist pattern on a layered conductor by photolithography to selectively remove the conductor by etching, can be used.

In general, patterning of a conductor for forming the first conductive layer 2 and the second conductive layer 3 is performed after forming of a via hole 4.

In order to increase wiring density, each of the first conductive layer 2 and the second conductive layer 3 may have a configuration that includes a land to which a via hole 4 is connected; and a wiring pattern of which the width is smaller the width of than such a land and that extends linearly.

A material of each of the first conductive layer 2 and the second conductive layer 3 is not restricted as long as it is a conductive material. For example, metal such as copper, aluminum, or nickel is used. In general, copper being a relatively inexpensive and of high conductivity is used. A material of which the first conductive layer 2 is formed may differ from a material of which the second conductive layer 3 is formed. A plating process may be performed with respect to a surface of each of the first conductive layer 2 and the second conductive layer 3.

A lower limit of a mean thickness of each of the first conductive layer 2 and the second conductive layer 3 is preferably 2 µm, and more preferably 5 µm. On the other hand, an upper limit of a mean thickness of each of the first conductive layer 2 and the second conductive layer 3 is preferably 500 µm, and more preferably 100 nm. If a mean thickness of each of the first conductive layer 2 and the second conductive layer 3 is smaller than the above lower limit, conductivity may be insufficient. On the other hand, if a mean thickness of each of the first conductive layer 2 and the second conductive layer 3 exceeds the above upper limit, flexibility may be insufficient.

A lower limit of a mean width of wiring patterns of each of the first conductive layer 2 and the second conductive layer 3 is preferably 10 µm, and more preferably 15 µm. On the other hand, an upper limit of a mean width of wiring patterns of each of the first conductive layer 2 and the second conductive layer 3 is preferably 500 µm, and more preferably 300 µm. If a mean width of wiring patterns of each of the first conductive layer 2 and the second conductive layer 3 is smaller than the above lower limit, a given wiring pattern may be discontinuous. Additionally, if a mean width of wiring patterns of each of the first conductive layer 2 and the second conductive layer 3 exceeds the above upper limit, a connection hole 5 can be increased to ensure a connection between the first conductive layer 2 and the second conductive layer 3, even in a case of the present embodiment of the present disclosure not being applied; accordingly, an advantage of the embodiment of the present disclosure may be impaired.

<Via Hole>

The via hole 4 can have a configuration that includes a base conductive layer which is laminated to an inner surface of the connection hole 5; a surface of the first conductive layer 2 that is opposite to the substrate layer 1; and a surface of the second conductive layer 3 that is exposed on the inside of the connection hole 5 and that includes a main conductive layer that is further laminated to the base conductive layer.

(Base Conductive Layer)

The base conductive layer is a thin, conductive layer and is used as an object to be deposited when a main conductive layer is formed by electroplating. The base conductive layer can be formed by a metal that is laminated by electroplating. Metal of which a base conductive layer is formed includes metal such as copper, silver, nickel, or palladium. Among them, copper being of low electric resistance is preferable in terms of excellence in flexibility; ability to increase thickness; and adhesion of electro copper plating.

When a given base conductive layer is formed by electroless copper plating, a lower limit of a mean thickness of the base conductive layer is preferably 0.01 µm, and more preferably 0.2 µm. On the other hand, an upper limit of a mean thickness of the base conductive layer is preferably 1 µm, and more preferably 0.5 µm. If a mean thickness of the base conductive layer is smaller than the above lower limit, continuity of the base conductive layer cannot be ensured, and thus a main conductive layer may be unable to be uniformly formed. Additionally, if a mean thickness of the base conductive layer exceeds the above upper limit, costs may be increased undesirably.

Electroless plating for forming a base conductive layer, is a process of depositing a metal having catalytic activity, by a reduction action of a catalyst, and can be performed by applying various electroless plating solutions that are commercially available. In such a manner, with electroless plating being used to form a base conductive layer, the base conductive layer is easily laminated, and an additional main conductive layer can be reliably laminated.

(Main Conductive Layer)

The main conductive layer is formed of a metal that is laminated to a base conductive layer by electroplating. In such a manner, a base conductive layer is formed and then a main conductive layer is disposed on an inner periphery of the base conductive layer. Thereby, a via hole 4 with excellent conductivity can be formed easily and reliably.

Metal of which a main conductive layer is formed includes copper, nickel, or the like. Among them, copper being inexpensive and of low electric resistance, is preferably used.

A lower limit of a mean thickness of the main conductive layer is preferably 1 µm, and more preferably 5 µm. On the other hand, an upper limit of a mean thickness of the main conductive layer is preferably 50 µm, and more preferably 30 µm. If a mean thickness of the main conductive layer is smaller than the above lower limit, a via hole 4 breaks due to bending of a printed wiring board 1, or the like, and thus an electric connection between a first conductive layer 2 and a second conductive layer 3 may be interrupted. Additionally, if a mean thickness of the main conductive layer exceeds the above upper limit, a printed wiring board 1 may become excessively thick, or a manufacturing cost may increase undesirably.

In an electroplating process of forming a main conductive layer, with respect to a base conductive layer as an object to be deposited, metal is laminated by electroplating to form a main conductive layer that contacts an inner periphery of the base conductive layer, so that a via hole 4 having a sufficient thickness can be formed. In this case, in order to prevent contact with a plating solution, a resist pattern is laminated to: a portion of an outer surface of a first conductive layer 2 other than a land section on which a via hole 4 is formed; and an outer surface of a second conductive layer 3.

<Connection Hole>

The connection hole 5 is defined by: a cylindrical portion that is taken along a thickness direction of a substrate layer 1 and a first conductive layer 2 and that includes a portion of a connection hole 5 excluding expansion sections; each conical portion as an example that indicates a given expansion section 6 for locally expanding, in a circumferential direction, a portion of an edge of the cylindrical portion toward a first conductive layer; and the like.

For example, punching, drilling, laser processing, or the like can be used as a method of forming a portion of a connection hole 5 excluding expansion sections 6. Among them, laser processing that is capable of accurately forming a fine connection hole 5, is particularly preferable.

A lower limit of a mean diameter for portions of connection holes 5 each excluding expansion sections 6, i.e., cylindrical portions, is preferably 30 µm, and more preferably 50 µm. On the other hand, an upper limit of a mean diameter for portions of connection holes 5 each excluding expansion sections 6 is preferably 150 µm, and more preferably 100 µm. If a mean diameter for portions of connection holes 5 each excluding expansion sections 6 is smaller than the above lower limit, in a case of forming a via hole 4 (especially, a main conductive layer), the air in a connection hole 5 cannot be ejected by a plating solution, and thus an inner surface of the connection hole 5 cannot be plated. Thereby, a first conductive layer 2 and a second conductive layer 3 may be unable to be securely connected. Additionally, if a mean diameter for portions of connection holes 5 each excluding expansion sections 6 exceeds the above upper limit, a plating solution can be injected into a connection hole 5 even in a case where an expansion section 6 is not formed, and an applied embodiment of the present disclosure may not provide an advantage.

(Expansion Section)

A given expansion section 6 is formed to extend more deeply than a thickness of the first conductive layer, such that cross-section of the connection hole 5 along at least the surface of the substrate layer 1 at the first conductive layer indicates an irregular shape.

A given expansion section 6 whose cross-sectional area taken along a thickness direction varies, may be formed by milling using a conical-shaped cutting tool; a three-dimensional process using a multi-axis processing machine; or the like, for example. However, a given expansion section 6 can be formed relatively easily by emitting laser light perpendicularly to the first conductive layer 2, for a short time.

A lower limit of length (hereinafter, the maximum length) of a longest portion of a given expansion section 6 with respect to a thickness direction thereof, is preferably 1.2 times the thickness of the first conductive layer 2, and more preferably 1.5 times. On the other hand, an upper limit of the maximum length of a given expansion section 6 with respect to a thickness direction thereof is preferably 0.9 times a total thickness of the substrate layer 1 and the first conductive layer 2, and more preferably 0.7 times. If the maximum length of a given expansion section 6 with respect to a thickness direction thereof is smaller than the above lower limit, the air in a connection hole 5 may be unable to be ejected by a plating solution. Additionally, if the maximum length of a given expansion section 6 with respect to a thickness direction thereof exceeds the above upper limit, it is necessary to increase a land of the second conductive layer 3 in consideration that the expansion section 6 may reach a surface of the substrate layer 1 toward the second conductive layer 3 due to a manufacturing error, or alternatively, it is necessary to increase a land of the first conductive layer 2 due to increases in a diameter of the expansion section 6 that is toward an outer surface of the first conductive layer 2. For this reason, densification of a wiring pattern of the first conductive layer 2 or the second conductive layer 3 may be prevented.

A lower limit of a mean diameter for expansion sections 6 at an outer surface (surface opposite the substrate layer 1) of the first conductive layer 2 is preferably 0.1 times a mean diameter for the portions of the connection holes 5 each excluding expansion sections 6, and more preferably 0.2 times. On the other hand, an upper limit of a mean diameter for expansion sections 6 at an outer surface of the first conductive layer 2 is preferably 0.5 times a mean diameter for the portions of the connection holes 5 each excluding expansion sections 6, and more preferably 0.4 times. If a mean diameter for expansion sections 6 at an outer surface of the first conductive layer 2 is smaller than the above lower limit, a cross-sectional area of an expansion section 6 is reduced, and thus the air in the connection hole 5 may be unable to be reliably ejected by a plating solution. Additionally, if a mean diameter for expansion sections 6 at an outer surface of the first conductive layer 2 exceeds the above upper limit, a land of the second conductive layer 2 needs to be increased. For this reason, densification of a wiring pattern of the first conductive layer 2 may be prevented.

A lower limit of a mean distance between both outer edge ends of each expansion section 6 at an outer surface of a first conductive layer, is preferably 0.1 times a mean diameter for the portions of the connection holes 5 each excluding expansion sections 6, and more preferably 0.2 times. On the other hand, an upper limit of a mean distance between both outer edge ends of each expansion section 6 at an outer surface of the first conductive layer is preferably 0.5 times a mean diameter for the portions of the connection holes 5 each excluding expansion sections 6, and more preferably 0.4 times. If a mean distance between both outer edge ends of each expansion section 6 at an outer surface of the first conductive layer is smaller than the above lower limit, a cross-sectional area of an expansion section 6 is reduced, and thus the air in a connection hole 5 may be unable to be reliably ejected by a plating solution. Additionally, if a mean distance between both outer edge ends of each expansion section 6 at an outer surface of the first conductive layer exceeds the above upper limit, an expansion section 6 is increased in width and thus a difference between flow velocities of a plating solution is decreased. For this reason, the air in a connection hole 5 may be unable to be reliably ejected.

The number of expansion sections 6 may be one, and plural, e.g., four or more is preferably set so that an effect of the air ejecting from a connection hole 5 is less likely to differ depending on a flow direction of a plating solution. Additionally, from the viewpoint of a flow direction of a plating solution, expansion sections 6 are preferably provided to be spaced at circumferentially regular intervals.

<Advantages>

With respect to the printed wiring board, with a cross-sectional shape of a connection hole 5 along at least one surface of the substrate layer 1 being an irregular shape, in a case of forming a via hole 4 by plating, variation in a flow velocity of a plating solution that flows into the connection hole 5 increases. Thereby, the air in the connection hole 5 is prevented from being retained as a dome-shaped bubble to allow the connection hole 5 to be filled with a plating solution. Therefore, with respect to the printed wiring board, the via hole 4 is formed along an inner surface of the connection hole 5 to have an even thickness, and thus a connection between the first conductive layer 2 and the second conductive layer 3 is securely made through the via hole 4.

[Other Embodiments]

The embodiment disclosed herein should be considered to be illustrative in all respects and not to be restrictive. A scope of the present invention is not limited to the configuration of the above embodiment. Such a scope is set forth by the claims, and is intended to include all modifications implementing the equivalent and made within the scope.

With respect to a printed wiring board, a first conductive layer and a second conductive layer are relative, and a conductive layer that is a first conductive layer toward one via hole may be a second conductive layer toward another via hole.

A printed wiring board may be a multilayer wiring board in which an additional substrate layer and conductive layer are laminated. A printed wiring board may also include other layers such as a coverlay, a solder resist, a shielded film, and the like.

A via hole in a printed wiring board may be a through-hole through which all conductive layers pass; or an interstitial via hole that couples conductive layers within a multilayer wiring board.

Figure 3:
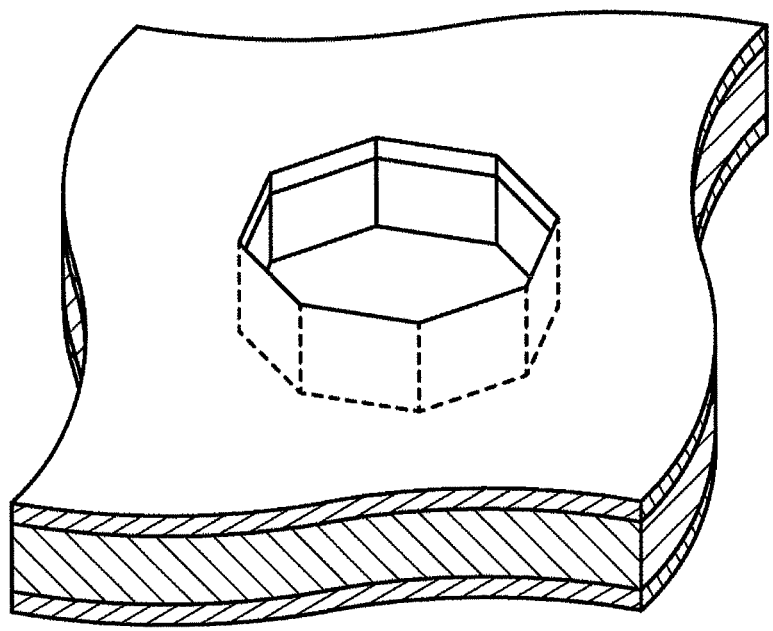
FIG. 3 is a schematic perspective view of a connection hole unlike in FIG. 2.

A cross-sectional shape of a connection hole that is along one surface of a substrate layer in a printed wiring board may not include an expansion section, as long as it is an irregular shape. As an example, a connection hole in a printed wiring board may have a polygonal cross-sectional shape, as illustrated in FIG. 3.

Figure 4:
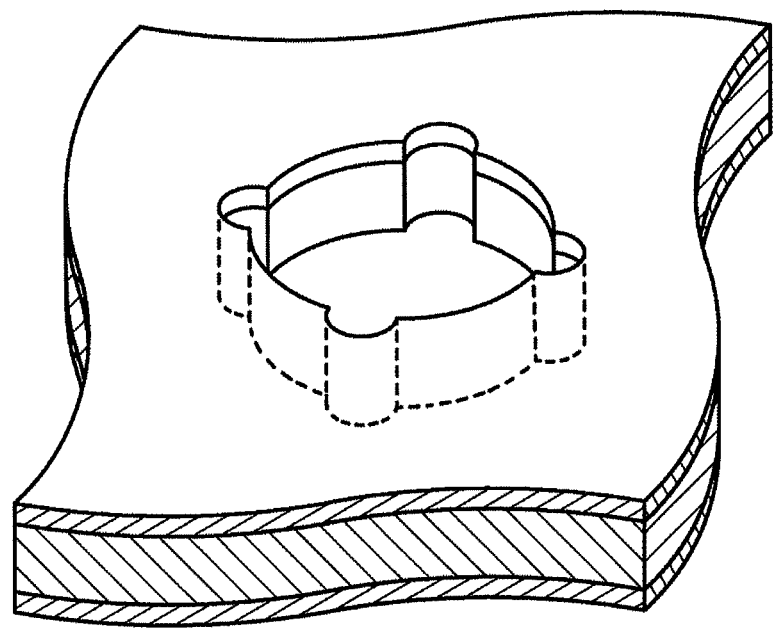
FIG. 4 is a schematic perspective view of a connection hole unlike in FIGS. 2 and 3.

An expansion section of a connection hole in a printed wiring board may be formed in a groove shape whose uniform section extends the entirety of the thicknesses of a substrate layer and a first conductive layer, as illustrated in FIG. 4, for example.

Figure 5:
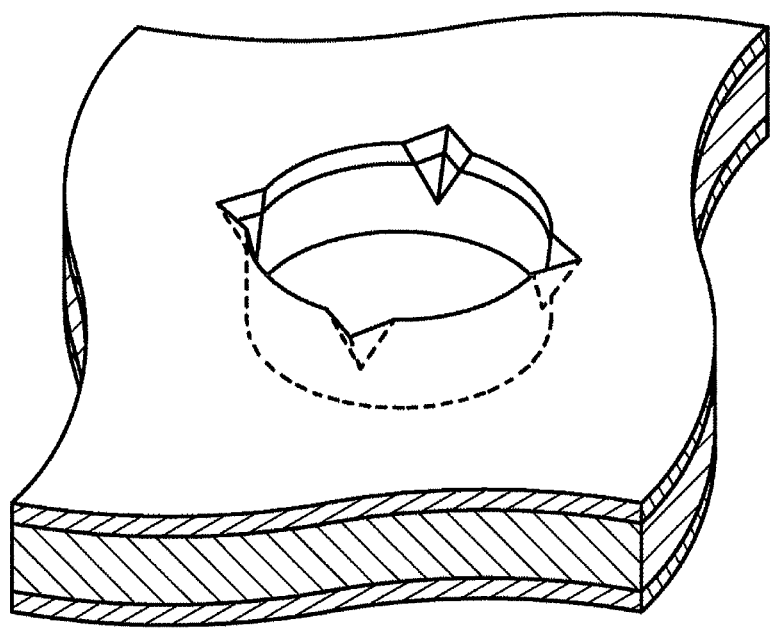
FIG. 5 is a schematic perspective view of a connection hole unlike in FIGS. 2 to 4.
Figure 6:
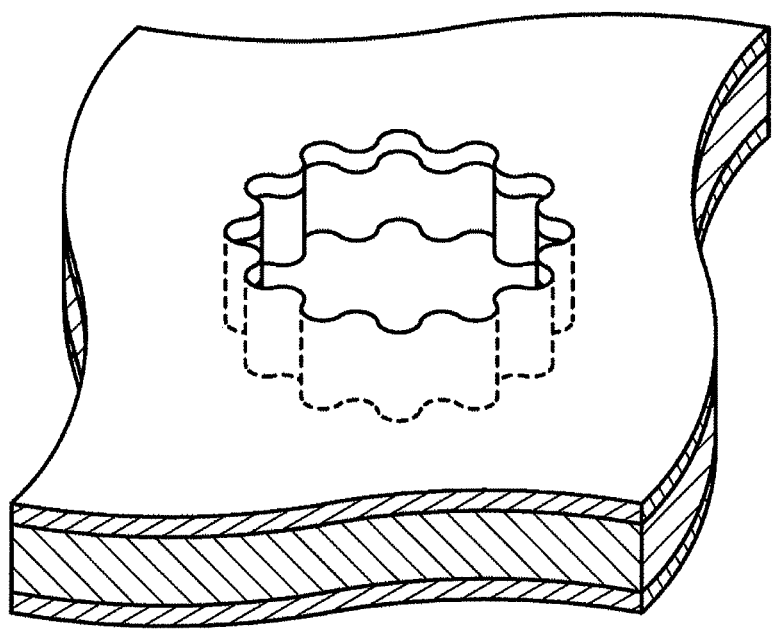
FIG. 6 is a schematic perspective view of a connection hole unlike in FIGS. 2 to 5.

A cross-sectional shape of an expansion section of a connection hole in a printed wiring board is not limited to a round. As an example, an expansion section in a printed wiring board may have a triangular cross-section, as illustrated in FIG. 5. With respect to expansion sections of a given connection hole in a printed wiring board, connection hole portions excluding the respective expansion sections may be smoothly coupled to each other, as illustrated in FIG. 6.

EXAMPLES

The present invention will be described below in detail below using examples. However, the present invention is not to be construed as being restricted by the description of the examples.

In order to confirm an effect of the present disclosure, prototype Example 1 of a flexible printed wiring board in which a via hole is formed with a connection hole whose cross-section is circular, as well as prototype Example 2 of a flexible printed wiring board in which a via hole is formed with a connection hole having a conical expansion section, were produced plurally. Then, a continuity check of via holes was conducted.

In prototype Example 1, a lamination in which a copper foil having a thickness of 12 μm, as each of a first conductive layer and a second conductive layer, was laminated to a given substrate layer that was formed by a polyimide film and that had a thickness of 32 μm, was used. Where, a connection hole having a hole diameter of 85 μm was formed, and a via hole having a total plating thickness of 8 μm was formed by electroless plating and electroplating in copper.

In prototype Example 2, four expansion sections in each of which an outer surface of a cylindrical hole whose hole diameter was 85 μm was expanded to be a conical surface, were formed every 90 degrees. Each expansion section was formed such that, each of a width and a diameter thereof along an outer surface of a first conductive layer was 30 μm (0.35 times the diameter of the cylindrical section); and such that a length thereof along a thickness direction of a substrate layer from an outer surface of a first conductive layer was 10 μm.

In prototype Example 1, continuity was checked with respect to 1,360,000 samples, and in prototype Example 2, continuity was checked with respect to 1,180,000 samples. As a result, in prototype Example 1, 14 continuity faults were found, but in prototype Example 2, continuity faults were not found.

As described above, it was confirmed that a connection fault of a first conductive layer and a second conductive layer could be prevented by providing an expansion section to form a connection hole.

REFERENCE SIGNS LIST

1 substrate layer
2 first conductive layer
3 second conductive layer
4 via hole
5 connection hole
6 expansion section

The invention claimed is:

1. A printed wiring board comprising:
an insulating substrate layer with one surface formed on an upper surface of the substrate layer and another surface formed on a lower surface of the substrate layer;
a first conductive layer directly laminated to the one surface of the substrate layer;
a second conductive layer directly laminated to the another surface of the substrate layer; and
a via hole formed along an inner surface of a connection hole that is provided, in a thickness direction, through the substrate layer and the first conductive layer, the via hole electrically coupling the first conductive layer and the second conductive layer, the via hole formed above the first conductive layer, and a lowermost surface of the via hole is above the second conductive layer,
wherein the connection hole includes an expansion section for partially expanding an edge of a cross-sectional shape of the connection hole along the one surface of the substrate layer,
wherein the expansion section is situated at the one surface of the substrate layer on which the first conductive layer is laminated, and is not situated at said another surface of the substrate layer on which the second conductive layer is laminated;
wherein a cross-sectional area of the expansion section taken along the thickness direction is increased toward the first conductive layer with respect to the second conductive layer; and
wherein a mean diameter for expansion sections at an outer surface of the first conductive layer is 0.1 to 0.5 times a mean diameter for portions of the connection holes each excluding one or more expansion sections.

2. The printed wiring board according to claim 1, wherein the expansion section is not present at another surface of the substrate layer.

3. The printed wiring board according to claim 2, wherein portions of the connection holes each excluding one or more expansion sections have a mean diameter of from 30 μm to 150 μm.

4. The printed wiring board according to claim 1, wherein portions of the connection holes each excluding one or more expansion sections have a mean diameter of from 30 μm to 150 μm.

5. The printed wiring board according to claim 4, wherein the mean diameter for portions of the connection holes each excluding one or more expansion sections is determined as a mean value of diameters each corresponding to respective arcs, each arc defining an arc area equivalent to an area bounded by an outer edge of a portion of a corresponding connection hole excluding the expansion sections and chords, and each chord joining both outer edge ends of a corresponding expansion section.

6. The printed wiring board according to claim 1, wherein the mean diameter for expansion sections at an outer surface of the first conductive layer is a mean value of diameters each corresponding to respective arcs, each of the arcs being an outer edge of a corresponding expansion section, such that each of the diameters is of a circle that includes an area bounded by an outer edge of the expansion section and a chord joining both outer edge ends of the expansion section, at the outer surface of the first conductive layer.

* * * * *